United States Patent
Xu

(10) Patent No.: US 10,720,936 B1
(45) Date of Patent: Jul. 21, 2020

(54) ADC RECONFIGURATION FOR DIFFERENT DATA RATES

(71) Applicant: eTopus Technology Inc., Sunnyvale, CA (US)

(72) Inventor: Danfeng Xu, Cupertino, CA (US)

(73) Assignee: eTopus Technology Inc., Sunnyvale, CA (US)

( * ) Notice: Subject to any disclaimer, the term of this patent is extended or adjusted under 35 U.S.C. 154(b) by 0 days.

(21) Appl. No.: 16/518,504

(22) Filed: Jul. 22, 2019

(51) Int. Cl.
*G11C 27/02* (2006.01)
*H03K 5/00* (2006.01)
*H03K 17/00* (2006.01)
*H03M 1/12* (2006.01)
*H03M 1/20* (2006.01)

(52) U.S. Cl.
CPC ........ *H03M 1/126* (2013.01); *H03M 1/121* (2013.01); *H03M 1/204* (2013.01)

(58) Field of Classification Search
CPC ....... H03M 1/126; H03M 1/204; H03M 1/121
USPC .......................................................... 327/94
See application file for complete search history.

(56) References Cited

U.S. PATENT DOCUMENTS

| | | | | |
|---|---|---|---|---|
| 8,798,219 | B2 * | 8/2014 | Buchwald | H03L 7/0814 375/350 |
| 8,902,094 | B1 * | 12/2014 | Zhang | H03L 7/0814 341/122 |
| 9,270,291 | B1 * | 2/2016 | Parnaby | H04L 7/0004 |
| 9,503,115 | B1 * | 11/2016 | Shin | H03M 1/1215 |
| 9,602,116 | B1 * | 3/2017 | Le | H03M 1/0604 |
| 2015/0263753 | A1 * | 9/2015 | Ramakrishnan | H03M 1/06 341/120 |
| 2015/0381195 | A1 * | 12/2015 | Sundblad | H03M 1/121 341/123 |

OTHER PUBLICATIONS

Kull, L. et al., "A 24-to-72GS/s 8b Time-Interleaved SAR ADC with 2.0-to-3.3pJ/conversion and >30dB SNDR at Nyquist in 14nm CMOS FinFET," 2018 IEEE International Solid-State Circuits Conference, Feb. 14, 2018, pp. 358-359.
Upadhyaya, P. et al., "A Fully Adaptive 19-to-56Gb/s PAM-4 Wireline Transceiver with a Configurable ADC in 16nm FinFET," 2018 IEEE International Solid-State Circuits Conference, Feb. 12, 2018, pp. 108-109.
Wang, L. et al., "A 64Gb/s PAM-4 Transceiver Utilizing an Adaptive Threshold ADC in 16nm FinFET," 2018 IEEE International Solid-State Circuits Conference, Feb. 12, 2018, pp. 110-112.

* cited by examiner

*Primary Examiner* — Metasebia T Retebo
(74) *Attorney, Agent, or Firm* — Fenwick & West LLP

(57) ABSTRACT

A receiver having analog-to-digital converters (ADC) is disclosed. The ADCs may be reconfigured based on the data rate of the receiver. For example, more portions of each time-interleaved ADC may be enabled to support a higher data rate of the receiver and less portions of the ADCs may be used to support a lower data rate of the receiver.

21 Claims, 7 Drawing Sheets

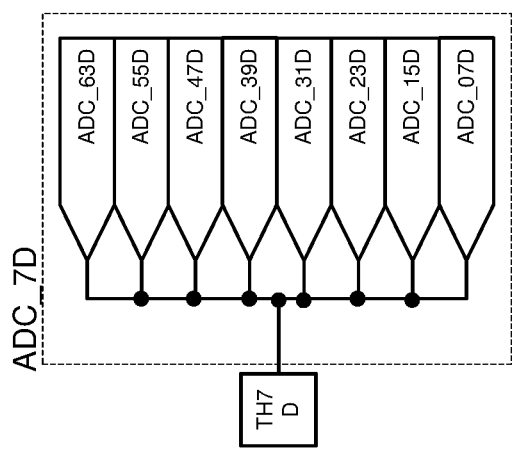

ADC RECONFIGURATION FOR DIFFERENT DATA RATES

BACKGROUND

1. Field of Art

The disclosure generally relates to a receiver device, more specifically to a receiver device including a reconfigurable analog-to-digital converter (ADC) based on data rate of the receiver.

2. Description of the Related Art

High speed communication systems transfer data over communication links at high data rates (e.g., 10 GS/s and beyond). Receiving devices in high speed communications systems can include analog-to-digital converters to convert the received analog signals into digital form for digital signal processing. As signaling speeds increase, the sampling rate of analog-to-digital converters included in the receiving devices will continue to increase in order for the receiving devices to recover data from the analog signals.

SUMMARY

Embodiments of the present disclosure include a receiver having time-interleaved analog-to-digital converters (ADC). The time-interleaved ADCs may be reconfigured depending on the configured data rate of the receiver. In one embodiment, the time-interleaved ADCs each includes a plurality of sub-ADCs where each sub-ADC samples an analog input signal at a different phase to generate digital samples of the analog input signal.

Depending on the configured data rate of the receiver, different sets of the sub-ADCs of each time-interleaved ADC may be enabled. For example, more of the sub-ADCs of each time-interleaved ADCs may be used to support a higher data rate of the receiver and fewer of the sub-ADCs of each time-interleaved ADCs may be used to support a lower data rate of the receiver. Thus, the time-interleaved ADC can be scaled depending on the desired data rate of the receiver.

The features and advantages described in the specification are not all inclusive and, in particular, many additional features and advantages will be apparent to one of ordinary skill in the art in view of the drawings, specification, and claims. Moreover it should be noted that the language used in the specification has been principally selected for readability and instructional purposes only, and may not have been selected to delineate or circumscribe the inventive subject matter.

BRIEF DESCRIPTION OF DRAWINGS

The disclosed embodiments have advantages and features that will be more readily apparent from the detailed description, the appended claims, and the accompanying figures (or drawings). A brief introduction of the figures is below.

FIG. 2B is a detailed block diagram of a sub-ADC, according to an embodiment.

DETAILED DESCRIPTION

The Figures (FIGS.) and the following description relate to embodiments by way of illustration only. It should be noted that from the following discussion, alternative embodiments of the structures and methods disclosed herein will be readily recognized as viable alternatives that may be employed without departing from the principles of what is claimed. Reference will now be made in detail to several embodiments, examples of which are illustrated in the accompanying figures. It is noted that wherever practicable similar or like reference numbers may be used in the figures and may indicate similar or like functionality.

Receiver Architecture

Figure 1:
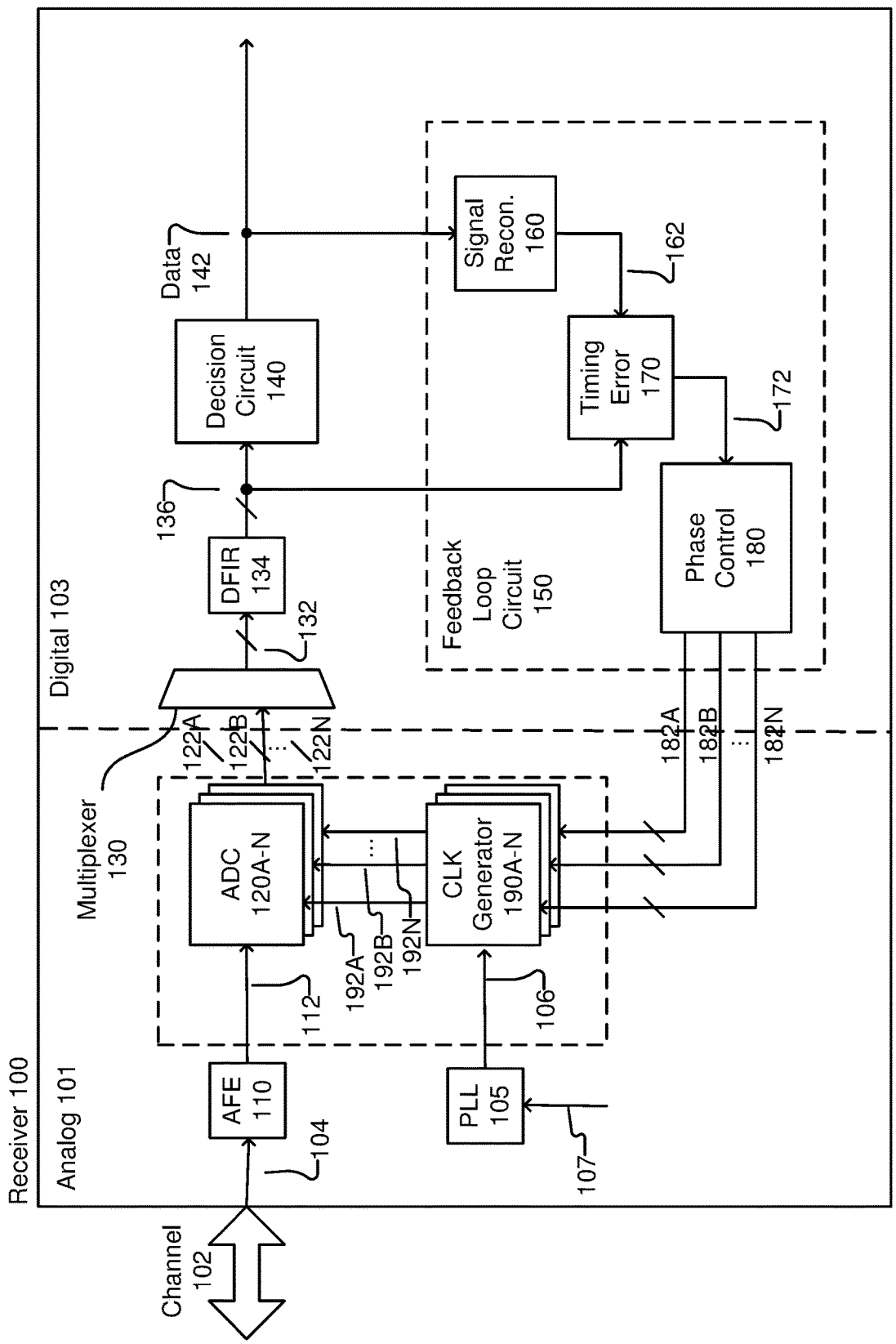
FIG. 1 is a high-speed communication system that includes a receiver, according to an embodiment.

FIG. 1 is a high-speed communication system that includes a receiver 100, according to one embodiment. The receiver 100 includes an analog portion 101 and a digital portion 103. The analog portion 101 of the receiver 100 is coupled to a communications channel 102 and receives an analog channel signal 104 from a remote transmitter (not shown) through the communications channel 102. The communications channel 102 can be, for example, an electrical communication channel found in a computing backplane that carries single ended or differential signals. The communications channel 102 can also be, for example, an optical communication channel.

The analog channel signal 104 is generated at the transmitter from digital data. The receiver 100 recovers digital data 142 from the channel signal 104 at the digital portion 103 of the receiver 100. In some embodiments, the receiver 100 can be a standalone device or part of a larger device, such as an application specific integrated circuit (ASIC). The analog portion 101 of the receiver 100 includes an analog front end (AFE) 110, analog to digital converters (ADCs) 120A-N, PLL (phase locked loop) 105, and clock generators 190A-N. The digital portion 103 of the receiver 100 includes multiplexer 130, a digital finite impulse response (DFIR) filter 134, a data decision circuit 140, and a feedback loop circuit 150. The feedback loop circuit 150 includes a signal reconstruction circuit 160, a timing error circuit 170 and a phase control circuit 180. Each of these components can be implemented with hardware circuits that generate signals, and the lines connecting the components carry signals from one component to the next.

The AFE 110 performs pre-processing on the received channel signal 104 using analog processing techniques to generate an analog input signal 112. The channel signal 104 can be non-ideal due to channel impairments, such as insertion loss, crosstalk, inter symbol interference and optical dispersion, and the AFE 210 uses analog processing to reduce some of these non-idealities. Examples of analog processing techniques include gain adjustment or continuous time equalization filters. In other embodiments, the AFE 110 can simply be an input terminal that receives the channel signal 104 and passes it on to generate the analog input signal 212 with no signal processing.

The input of the ADCs 120A-N is coupled to the output of AFE 110. Each ADC 120 converts analog input signal 112 into digital input samples 122 by sampling the analog input signal 112 and then rounding or quantizing the sampled input signal 112 to its closest digital value. Each digital value represents a different voltage level of the sampled input signal 112. Each ADC 120 outputs an M bit digital code in binary form.

The sampling phase of each ADC 120 is controlled by its own sampling clock signal 192. For example, ADC 120A generates samples 122A at a phase of sampling clock signal 192A, and ADC 120B generates samples 122B at a phase of sampling clock signal 192B, and so on. Each of the sampling clocks signals 192A-N has different phases from one another, which causes each corresponding ADC 120 to sample the analog input signal 112 at a different phase.

The multiplexer 130 receives the digital input samples 122A-N from the ADCs 120A-N and selects one digital input sample 122A-N at a time for its output. The multiplexer 130 selects between the digital input samples 122A-N in round robin manner such that all the digital input samples 122A-N are interleaved together to form a continuous stream of digital samples. The stream of digital samples is output via digital input signals 132.

DFIR filter 134 receives the digital input signals 132 that is indicative of the digital samples and filters the digital input signals 132 into filtered digital input signals 136. The DFIR filter 134 is a filter whose impulse response has finite duration. The DFIR filter 134 produces filtered digital input signals 136 having values that are equal to a weighted sum of the delayed samples indicated by digital input signals 132. The DFIR filter 134 can include a number of taps, where each tap represents a different delayed sample. Each tap is weighted and summed together to produce the filtered digital input signals 136. The number of taps and weights can vary depending on the tuning needs of the receiver 100.

The decision circuit 140 receives the filtered digital input signals 136 and makes a data decision on the logical data value represented by the digital samples of the filtered digital input signals 136, thereby recovering data 142. The recovered data 142 can be a single-bit data (e.g., NRZ) or multi-bit data (e.g., PAM-4). In one embodiment, the data decision circuit 140 includes a digital comparator that compares each value of filtered digital input signals 136 to a threshold value and uses the result of the comparison as the recovered data 142. In one embodiment, the data decision circuit 140 is a digital signal processor (DSP) that recovers data 142 from the filtered digital input signals 136 using digital signal processing algorithms. Examples of the data decision circuit 140 include adaptive equalizers, decision feedback equalizers (DFE) and maximum likelihood sequence detector (MLSD) (e.g., a Viterbi decoder). The data decision circuit 140 can also be referred to as a data recovery circuit.

The feedback loop circuit 150 is coupled to the outputs of the DFIR 134 and the data decision circuit 140. The feedback loop circuit 150 receives the filtered digital input signals 136 and the recovered data 142, and generates digital phase control signals 182A-N using these two inputs. At high speed signaling, the sampling phases of ADCs 120A-N can have a substantial effect on the accuracy of the data 142 recovered by the receiver 100. The feedback loop circuit 150 generates the digital phase control signals 182 through continuous and interlocking feedback to ensure that the phase of the sampling clock signals 192A-N is correct. As previously mentioned, the feedback loop circuit 150 can include the signal reconstruction circuit 160, the timing error circuit 170 and the phase control circuit 180.

The signal reconstruction circuit 160 receives the recovered data 142 and generates reconstructed digital input signals 162 from the recovered data 142. The reconstructed input signals 162 are a reconstructed and ideal version of the filtered digital input signals 136. In other words, the reconstructed input signals 162 represent ideal samples that are expected to be input to data decision circuit 140 if the sampling phase of the ADC 120 were ideal. If the phase of sampling clock signal 192 were at its ideal phase and resulted in ideal samples, the reconstructed input signals 162 would match exactly with the filtered digital input signals 136. However, when the phase of sampling clock signal 192 is not at the ideal phase, the reconstructed input signals 162 will be different than the filtered digital input signals 136. Reconstructed input signals 162 can also be referred to as reference signals or target signals.

The timing error detector 170 receives the filtered digital input signals 136 and the reconstructed input signals 162 and determines if there is a difference between the two types of signals. Timing error detector 170 generates digital timing error signals 172 that indicate the presence of and degree of timing error in sampling of the analog input signal 112. The timing error signals 172 can include a series of timing error values where each timing error value represents the timing error associated with the sampling phase of a particular ADC 120.

In one embodiment, timing error detector 170 is a type of minimum mean square error (MMSE) detector. The MMSE detector determines a mean square error (MES) between the filtered digital input signals 136 and the reconstructed input signals 162. The MMSE detector then computes a gradient (i.e., slope) of the MSE over time and outputs timing error signals 172 that are indicative of a gradient of the MSE relative to a phase timing error. The gradient represents a direction in which the MSE is moving and how fast the MSE is moving in that direction.

The phase control circuit 180 receives and processes the timing error signals 172 to generate the digital phase control signals 182A-N. Each of the digital phase control signals 182A-N includes a phase control value representing a target phase of a respective sampling clock signals 192A-N. The phase control circuit 180 includes interlocking feedback paths (not shown) that use one of the digital phase control signals 182N in generating the other digital phase control signals 182A-M. The interlocking paths enable digital phase control signals 182A-N to settle to their proper values within a short amount of time. In one embodiment, the phase control circuit 180 also generates a clock skew calibration signal 211 that corrects skew in the sampling clock signals, as further described below.

A phase-locked loop 105 generates a locked clock signal 106 input to the CLK generator 190A-N. The phase locked loop 105 generates the locked clock signal 106 based on a reference clock signal 107 received from an oscillator (not shown). The phase locked loop 105 may lock the reference clock signal 107 to a desired frequency (e.g., 28 GHz) and output to the clock generators 190A-N.

The clock generators 190A-N generate the sampling clock signals 192A-N based on the digital phase control signals 182A-N and the locked clock signal 106. Specifically, the clock generators 190A-N adjust a phase of the sampling clock signals 192A-N in accordance with the phase control values of the digital phase control signals 182A-N. In one embodiment, the clock generators 190A-N are phase interpolators that move the pulses of the sampling clock signals 192A-N forward or backwards in time. For example, if digital phase control signal 182A changes values from "7" to "8," the clock generator 190A can move the pulses of the sampling clock signal 192A in a direction that increases a phase delay of the sampling clock signal 192A. The phase of the sampling clock signals 192A-N is adjusted to reach a steady state during which the filtered timing error signals 172 have a mean value of zero.

Clock Generator Architecture

Figure 2A:
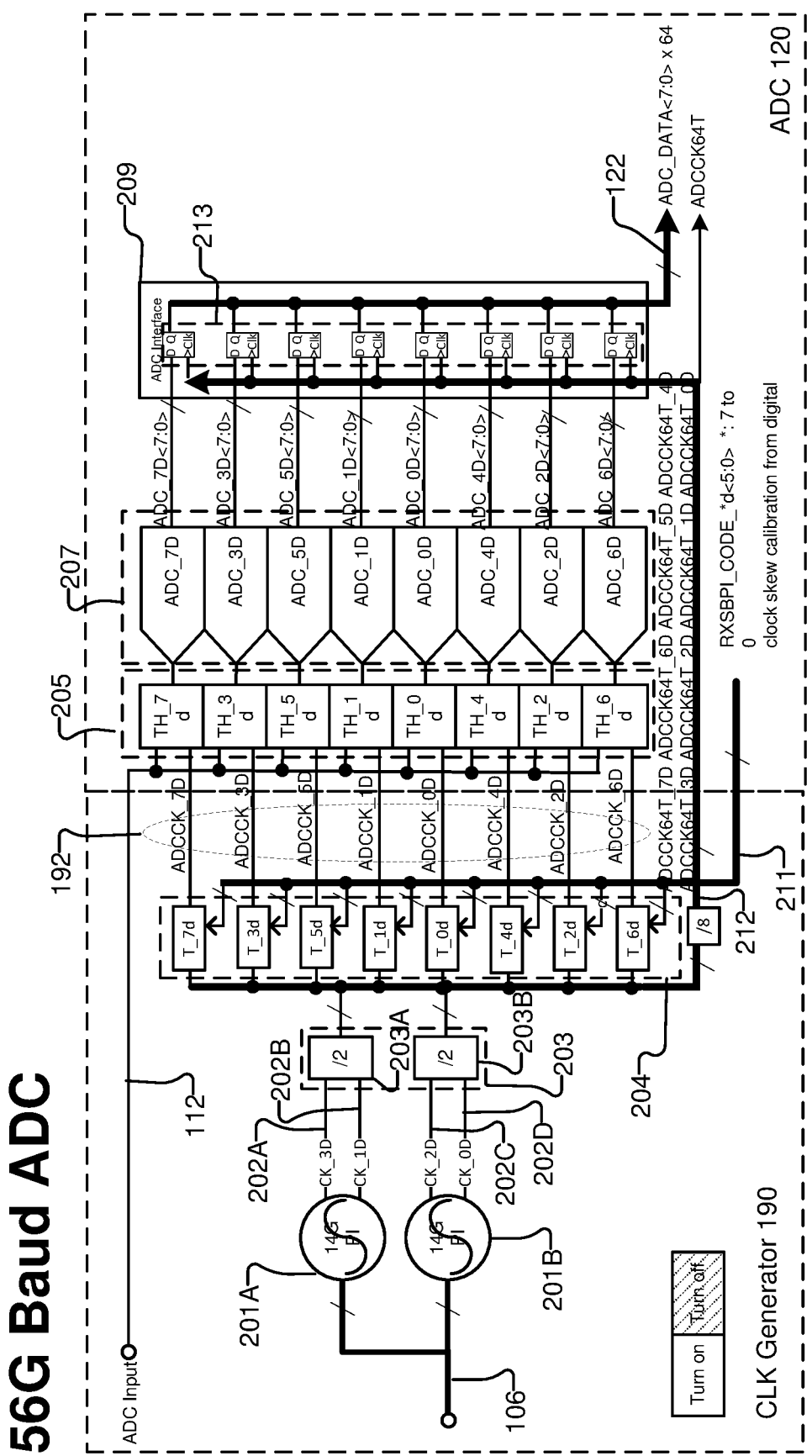
FIG. 2A is a detailed block diagram of an analog-to-digital converter (ADC) and clock generator in the receiver of FIG. 1 operating at a first data rate, according to an embodiment.

FIG. 2A is a detailed block diagram of the ADC 120 and clock generator 190 in the receiver 100, according to one embodiment. As shown in FIG. 2A, the clock generator 190 includes circuitry for generating the sampling clock signal 192. In one embodiment, the circuitry of the clock generator 190 includes a plurality of phase interpolators 201, a clock divider 203, and a clock delay 204. Note in other embodiments, the clock generator 190 can have different components other than those shown in FIG. 2A.

In one embodiment, the phase interpolators 201 include phase interpolator 201A and phase interpolator 201B having inputs that receive the locked clock signal 106 generated by the phase-locked loop 105. The locked clock signal 106 received by the phase interpolators 201 is a reference clock signal used by the phase interpolators 201 and clock divider 203 to generate the sampling clock signal 192. The phase interpolators 210 may be 14G phase interpolators, for example. Although only two phase interpolators are shown in FIG. 2A, the clock generator 190 may have any number of phase interpolators.

Each phase interpolator 201 generates a plurality of clock signals (e.g., two clock signals) from the locked clock signal 106. In one embodiment, the clock signals generated by both phase interpolators 201A, 201B have the same frequency. For example, the clock signals generated by the phase interpolators 201A, 201B are 14 GHz clock signals.

While the clock signals generated by the phase interpolators 201 are the same frequency, the plurality of clock signals have different phases. For example, phase interpolator 201A generates clock signal 202A with a 270-degree phase shift and clock signal 202B with a 90-degree phase shift, and phase interpolator 201B generates clock signal 202C with a 180-degree phase shift and clock signal 202D with a 0-degree phase shift. Each 90-degree phase shift of the 14 GHz clock signals generated by the phase interpolators 201 represent 1UI. In one embodiment, 1UI refers to baud rate. For example, the baud rate of 56G PAM4 is 28G so 1UI of 56G PAM4 is 90 degrees of 14G. The baud rate of 28 GHZ is 28G so 1UI is still 90 degrees of 14G.

In one embodiment, the clock divider 203 comprises a plurality of clock divider circuits 203. The clock divider 203 further divides the clocks signals generated by the phase interpolators 201 to generate eight phase clock signals (e.g., 7 Ghz clock signals). For example, each clock divider circuit 203 divides a clock signal input into the clock divider circuit 203 from a corresponding one of the phase interpolators 201 in half and divides the phase of the inputted clock signal in half. As a result, the clock signals generated by the clock dividers 203 have phases separated by 45 degrees, in one example.

Clock divider 203 may include clock divider circuit 203A and clock divider circuit 203B. Inputs of clock divider circuit 203A receive the clock signals generated by phase interpolator 201A. Inputs of clock divider circuit 203B receive the clock signals generated by phase interpolator 201B. Since each clock divider circuit 203 receives two clock signals, each clock divider circuit 203 generates four clock signals with different phases. Since the four clock signals generated by the phase interpolators 201 are shifted in phase by 90 degrees, the clock divider circuit 203 generates eight phase clocks with 45-degree phase difference.

For example, clock divider circuit 203A generates from the clock signal 202A with a 270-degree phase shift, a clock signal with a 135-degree phase shift and a clock signal with a 315-degree phase shift (180-degrees apart from the 135-degree phase shift). Clock divider circuit 203A also generates from clock signal 202B with the 90-degree phase shift, a clock signal with a 45-degree phase shift and a clock signal with a 225-degree phase shift (e.g., 180 degrees apart from the 45-degree phase shift).

Clock divider circuit 203B generates from clock signal 202C with the 180-degree phase shift a clock signal a 90-degree phase shift and a clock signal with a 270-degree phase shift (e.g., 180 degrees apart from the 90-degree phase shift). Clock divider 203B also generates from the clock signal 202D with the 0-degree phase shift a clock signal with the 0-degree phase shift and a clock signal with a 180-degree phase shift (e.g., 180 degrees apart from the 0-degree phase shift).

As mentioned above, the clock generator 190 also includes a clock delay 204. The inputs of the clock delay 204 are connected to the output of the clock divider 203. The outputs of the clock delay 204 are connected to the ADC 120 as shown in FIG. 2A. In one embodiment, the clock delay 204 receives the clock signals generated by the clock divider 203 and corrects skew in the clock signals. The corrected clock signals with different sampling phases are the sampling clock signals 192 used by the ADC 120 to sample the analog input signal 112. The clock delay 204 corrects skew in the sampling clock signals based on a clock skew calibration signal 211. The clock skew calibration signal 211 may be received from the digital portion 103 of the receiver 100. Specifically, the clock skew calibration signal 211 is received from the phase control 180.

As shown in FIG. 2A, the clock delay 204 includes a plurality of clock delay circuits T_nd (e.g., clock delay circuits T_7d to T_0d) where n is a positive integer. In one embodiment, the clock delay circuits T_nd are arranged in a non-sequential order. In the arrangement shown in FIG. 2A, clock delay circuit T_7d is the last clock delay circuit and clock delay circuit T_7d is the first clock delay circuit where each adjacent clock delay circuit is separated by a 45-degree phase differential. Each clock delay circuit T_nd receives a corresponding one of the clock signals from the clock divider 204 and corrects the skew of each clock signal based on the clock skew calibration signal 211.

As mentioned above, the clock divider 203 generates eight different sampling clock signals 192 where each clock signal has a different phase than the other clock signals. Thus, the clock delay 204 includes eight clock delay circuits T_d that each receive a corresponding one of the eight different clock signals and corrects the skew in the received clock signal. For example, clock delay circuit T_7d receives the clock signal with the least phase (e.g., 0-degree phase shift), clock delay circuit T_6d receives the clock signal with 45-degree phase shift, clock delay circuit T_5d receives the clock signal with 90-degree phase shift, clock delay circuit T_4d receives the clock signal with the 135-degree phase shift, clock delay circuit T_3d receives the clock signal with the 180-degree phase shift, clock delay circuit T_2d receives the clock signal with the 225-degree phase shift, clock delay circuit T_1d receives the clock signal with the 270-degree phase shift, and clock delay circuit T_0d receives the clock signal with the 315-degree phase shift.

Each clock delay circuit T_nd outputs a corrected clock signal ADCCK as shown in FIG. 2A. For example, clock delay circuit T_7d outputs corrected clock signal ADCCK_7D, clock delay circuit T_6d outputs corrected clock signal ADCCK_6D, clock delay circuit T_5d outputs corrected clock signal ADCCK_5D, clock delay circuit T_4d outputs corrected clock signal ADCCK_4D, clock delay circuit T_3d outputs corrected clock signal ADCCK_3D, clock delay circuit T_2d outputs corrected clock signal ADCCK_2D, clock delay circuit T_1d outputs corrected clock signal ADCCK_1D, and clock delay circuit T_0d outputs corrected clock signal ADCCK_10. In one embodiment, the corrected clock signals ADCCK collectively form the sampling clock signals 192.

ADC Architecture

As shown in FIG. 2A, each ADC 120 includes a track and hold device 205, sub-ADCs 205, and an ADC interface 209 according to one embodiment. The track and hold device 205 receives as its inputs the analog input signal 112 and the sampling clock signals 192. The track and hold device 205 tracks the analog input signal 112 and holds the value for a period of time. As shown in FIG. 2A, the track and hold device 205 includes a plurality of track and hold circuits TH (e.g., track and hold circuits TH_7d to TH_0d). Each track and hold circuit TH receives the analog input signal 112 and a corresponding one of the sampling clock signals 192.

In one embodiment, each track and hold circuit TH periodically samples the voltage level of the analog input signal 112 according to the sampling clock signal 192 received by the track and hold circuit TH and generates a sampled input signal as a result of the sampling. For example, track and hold circuit TH_7d samples the analog input signal 112 according to a sampling clock signal ADCCK_7D, track and hold circuit TH_6d samples the analog input signal 112 according to sampling clock signal ADCCK_6D, and so on. Similar to the clock delay circuits T_nd, the track and hold circuits TH are arranged in a non-sequential order.

Each track and hold circuit TH can be implemented by a switch connected to a capacitor. When the switch is closed, the track and hold circuit TH is in the "track" mode and tracks the analog input signal 112. When the switch opens, the last instantaneous value of the analog input signal 112 that was tracked is held in the capacitor and the track and hold circuit TH is in the "hold" mode.

The tracking phase of each track and hold circuit TH is controlled by pulses of the sampling clock signal received by the track and hold circuit TH. When the sampling clock signal is high, the track and hold circuit TH samples the analog input signal 112. When the sampling clock signal is low, the track and hold circuit TH holds the sampled value constant.

As shown in FIG. 2A, the track and hold device 205 is connected to a plurality of sub-ADCs 207 included in ADC 120. As shown in FIG. 2A, the sub-ADCs 207 are arranged in parallel. The sub-ADCs 207 include ADC_7D to ADC_0D where each sub-ADC is connected to a corresponding one of the track and hold circuits TH. For example, the input of ADC_7D is connected to the output of track and hold circuit TH7D, the input of ADC_6D is connected to the output of track and hold circuit TH6D, and so on. Thus, each sub-ADC 207 receives the sampled analog input signal from the track and hold circuit TH connected to the sub-ADC and generates a digital sample of the sampled analog input signal. Each sub-ADC 207 operates at a data rate corresponding to the frequency of the sampling clock signals 192. In this example, each sub-ADC 207 operates at 7 Gbps given that the sampling clock signals 192 are 7 Ghz clock signals.

Referring now to FIG. 2B, a detailed block diagram of a sub-ADC 207 is shown. In one embodiment, each sub-ADC 207 includes a plurality of time-interleaved successive approximation (SAR) ADC slices. As shown in FIG. 2B, the time-interleaved SAR ADC slices are arranged in parallel. Each SAR ADC generates a digital sample of the sampled analog input signal received by the sub-ADC from its corresponding track and hold circuit TH. The combination of the digital samples generated by the SAR ADC slices form the digital sample generated by the sub-ADC.

In one embodiment, each SAR ADC slice included in the sub-ADC 207 operates at a data rate that is based on the data rate of the sub-ADC 207 and the number of SAR ADC slices included in the sub-ADC 207. For example, given that the sub-ADC 207 operates at 7 Gbps and includes eight SAR ADC slices, each SAR ADC slice operates at a data rate of 875 Mbps with a total of 513 signals toggled.

Referring back to FIG. 2A, as mentioned above the ADC 120 also includes an ADC interface 209. The ADC interface 209 is coupled to the output of the sub-ADCs 207. The ADC interface 209 receives the digital samples of the sampled analog input signal outputted from the sub-ADCs 207. The ADC interface 209 aligns the digital samples in order to output the digital input samples 122. In one embodiment, the outputted digital input samples 122 have at least an 8-bit resolution.

In one embodiment, the ADC interface 209 aligns the digital samples based on interface clock signals 212. ADC interface 209 may receive a plurality of interface clock signals 212 where each interface clock signal 212 corresponds to one of the sub-ADC 207. The interface clock signals 212 are typically slower than the desired clock rate of the receiver 100. For example, interface clock signals 212 are 64 times slower than the desired clock rate of the receiver 100. If a 56G baud rate is configured for the receiver 100, the interface clock signals 212 are 875 MHz, for example.

As shown in FIG. 2A, the ADC interface 209 includes a set of registers 213 (e.g., flip flops). Each register includes an input connected to a corresponding one of the interface clock signals 212 and to the output of a corresponding one of the sub-ADCs 207. As will be further described below, the registers 213 and interface clock signals 212 may be used to turn off portions of the ADC interface 209 depending on the configured data rate of the receiver 100.

In one embodiment, each of the plurality of phase interpolators 201, clock dividers 203, clock delay circuits Td, track and hold circuits TH, and sub-ADCs 207 also includes a register. The register stores a value that either enables (e.g., turns on) or disables (e.g., turns off) the associated component that includes the register.

ADC Reconfiguration

In one embodiment, the time-interleaved ADCs 120 can be reconfigured based on the configured data rate of the receiver 100. The receiver 100 may be configured to operate at different data rates such as a maximum data rate (e.g., 56G), a minimum data rate (8G), and one or more intermediate data rates (e.g., 28G and 15G) between the maximum data rate and the minimum data rate. Based on the configured data rate of the receiver 100, each time-interleaved ADC 120 may be reconfigured by enabling or disabling parts of the ADC 120 and the clock generator 190. For example, all of the components included in the ADC 120 (e.g., track and hold circuits TH, sub-ADCs 207, and the entire ADC interface 209) may be enabled and all of the components of the clock generator 190 (e.g., phase interpolators 201, clock dividers 203, and clock delay circuits Td) may be enabled if the receiver 100 is configured to receive data at the maximum data rate. Conversely, only a portion of the components included in the ADC 120 and a portion of the clock generator 190 may be enabled if the receiver 100 is configured to operate at a data rate that is less than the maximum data rate, as will be further be described below.

When the receiver 100 is set to the maximum data rate, the ADCs 120 are set to a maximum data rate mode. In this example, the maximum data rate mode of the ADC 120 is a 56 Gbps mode assuming the maximum data rate for the receiver 100 is 56G. However, in other embodiments the maximum data rate can be different.

During the maximum data rate mode of the ADCs 120, all of components of each ADC 120 and the clock generator 190 are enabled as shown in FIG. 2A. That is, the entire set (e.g., a first set) of sub-ADCs 207, the entire set of track and hold circuits, and the entire portion of the ADC interface 209 included in each ADC 120 is enabled during the maximum data rate mode. Similarly, all of the phase interpolators, clock dividers 203, and clock delay circuits Td are enabled in the clock generator 190 during the maximum data rate mode.

In one embodiment, to enable all of components of the ADC 102 and the clock generator 190, the registers of all of the components included in the ADC 102 and the clock generator 190 store a value that enable the components. That is, each of the phase interpolators 201, clock divider circuits 203, clock delay circuits Td, track and hold circuits TH, sub-ADCs 207, and the entire ADC interface 209 have registers storing a value indicating enabling of the component.

In the maximum data rate mode, the ADCs 120 have a data rate of 56 Gbps with eight 7 Ghz clocks being generated by the clock generator 190. The 7 GHz clock signals are sent to the eight track and hold circuits TH and all eight sub-ADC 207 are operational at a data rate of 7 GBps with each SAR slice included in the sub-ADCs 207 operating at a data rate of 875 Mbps.

The ADC 120 is also reconfigurable to support lower data rates as mentioned above. By being able to reconfigure the ADC 120, the receiver 100 can support legacy communication standards. The ADC 120 is reconfigurable by enabling only a portion of the ADC 120 and the clock generator 190 and disabling remaining portions of the ADC 120 and clock generator 190. To disable portions of the ADC 120 and the clock generator 190, the registers of the components of the ADC 120 and the clock generator 190 store values that turn off the components.

Figure 3:
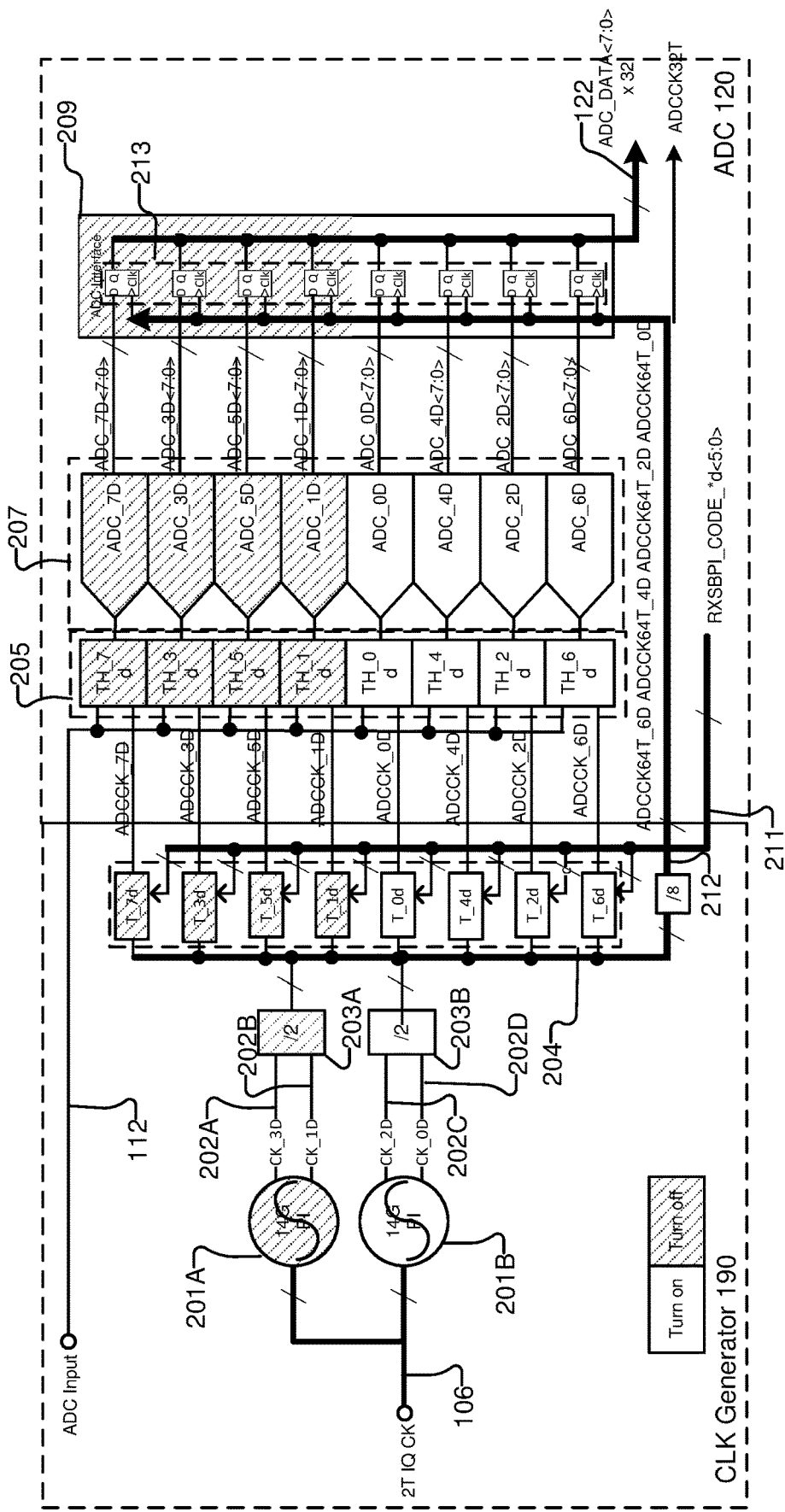
FIG. 3 is a detailed block diagram of the ADC and clock generator in the receiver of FIG. 1 operating at a second data rate, according to an embodiment.

FIG. 3 is an example of the receiver 100 operating at a data rate that is less than the maximum data rate for the receiver 100. In this example, the receiver 100 is operating at half of its maximum data rate. In the embodiments herein, the maximum data rate for the receiver 100 is 56G baud rate. Thus, the receiver 100 is operating at 28G baud rate and the ADC 120 shown in FIG. 3 is reconfigured to a first intermediate data rate mode (e.g., 28 Gbps rate).

Given that the data rate of the receiver 100 is half the maximum data rate, half of the components of the ADC 120 and the clock generator 190 are enabled and half are disabled during the first intermediate data rate mode to realize the desired data rate (e.g., 28 Gbps) as shown in FIG. 3. In FIG. 3, the clock generator 190 and the ADC 120 are respectively reconfigured such that a single phase interpolator and a second set of the sub-ADCs 207 (e.g., four of the sub-ADCs 207) are used in the first intermediate data rate mode.

As shown in FIG. 3, phase interpolator 201B and the second set of ADCs 207 including sub-ADC_0D, 4D, 2D, and 6D are enabled (e.g., turned on) and the remaining phase interpolator 201A and remaining set of sub-ADCs 7D, 3D, 5D, and 1D are disabled (e.g., powered off). The second set of ADCs 207 that are enabled during the first intermediate data rate mode is a subset of the first set of ADCs 207 that are enabled during the maximum data rate mode. Additionally, ADC 120 has improved phase linearity since a single phase interpolator is used during the first intermediate data rate mode rather than relying upon both phase interpolators to generate the clock signals for the enabled portion of the sub-ADC 207.

Furthermore, a portion of the clock divider 203B, a portion of the clock delay circuits T_0d, T_4d, T_2d, and T_6d, a portion of the track and hold circuits TH_0d, TH_4d, TH_2d, TH_6d, and a portion of the ADC interface 209 that are connected to the enabled phase interpolator 201B and the enabled set of the sub-ADC 207 are also enabled. Conversely, the remaining clock divider 203A, clock delay circuits T_7d, T_3d, T_5d, and T_1d, track and hold circuits TH_7d, TH_3d, TH_5d, TH_1d, and a portion of the ADC interface 209 that are connected to the disabled phase interpolator 201A and the disabled set of sub-ADCs 207 are also disabled. As described above, the components of the clock generator 190 and the ADC 120 are enabled or disabled based on the values stored in the registers of the components.

In one embodiment, FIG. 3 illustrates that the lower half of ADC 120 and the clock generator 190 are enabled while the upper half of the ADC 120 and the clock generator 190 are disabled. However, in other embodiments, the upper half of ADC 120 and the clock generator 190 are enabled while the lower half of the ADC 120 and the clock generator 190 are disabled.

Figure 4:
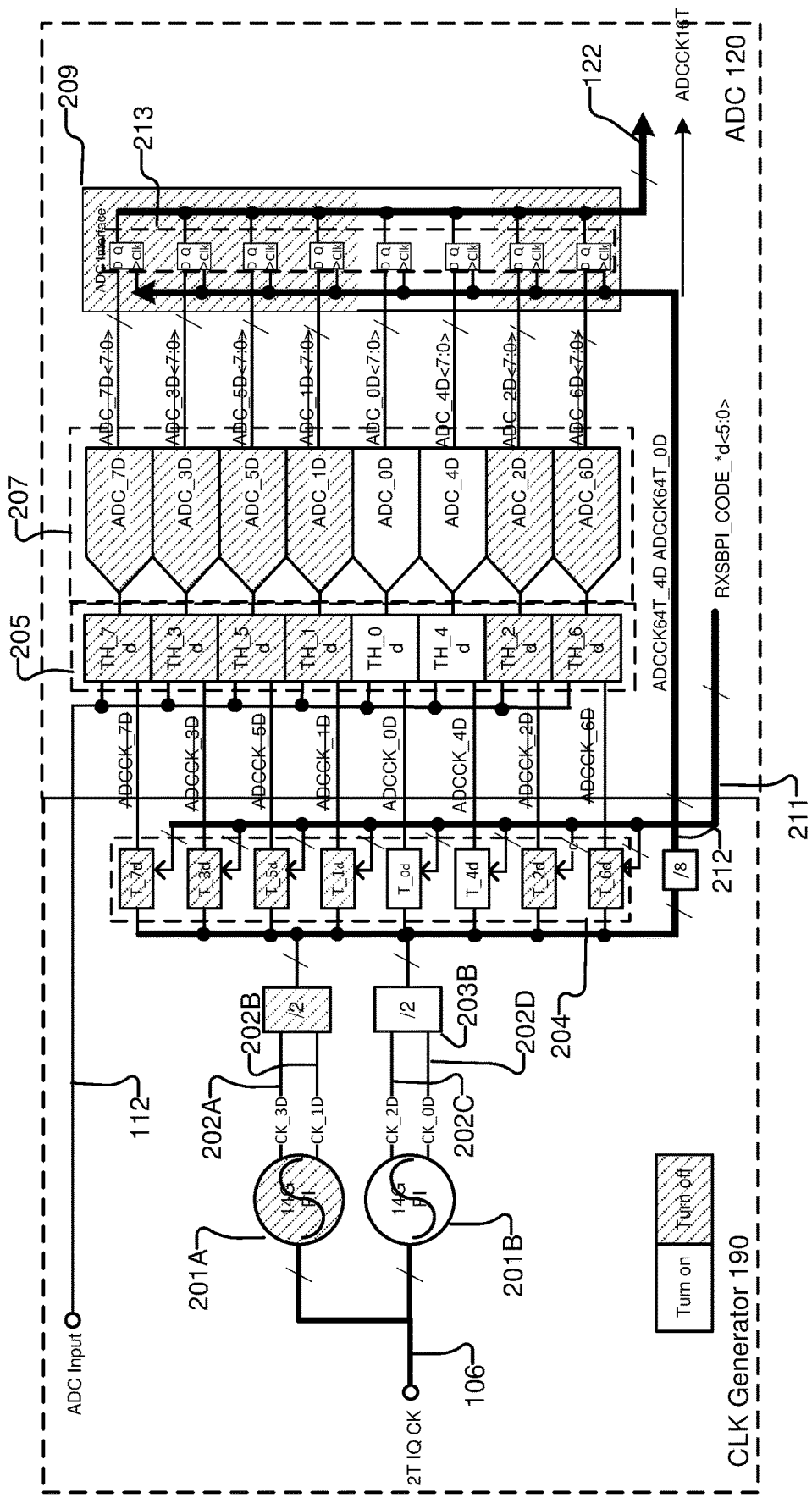
FIG. 4 is a detailed block diagram of the ADC and clock generator in the receiver of FIG. 1 operating at a third data rate, according to an embodiment.

FIG. 4 is another example of the receiver 100 operating at another intermediate data rate that is less than the maximum data rate for the receiver 100. In this example, the receiver 100 is operating at a second intermediate data rate that is less than the first intermediate data rate. For example, the receiver 100 is operating at 15G baud rate. The ADC 120 shown in FIG. 4 is reconfigured to a second intermediate data rate mode.

In the second intermediate data rate mode, the clock generator 190 and the ADC 120 are respectively reconfigured such that a single phase interpolator and a third set of sub-ADCs are enabled in the second intermediate data rate mode. In one embodiment, the third set of sub-ADCs includes two sub-ADCs such as sub-ADC_0D and 4D. Phase interpolator 201B is also enabled (e.g., turned on). Conversely, phase interpolator 201A and sub ADCs 7D, 3D, 5D, 1D, 2d, and 6D are disabled (e.g., turned off). Although ADC_0D and ADC_4D are enabled, in other embodiments any of the other sub-ADCs that are connected to phase interpolator 201B may be used in the second intermediate data rate mode.

Furthermore, the clock divider 203B, clock delay circuits T_0d and T_4d, track and hold circuits TH_0d and TH_4d, and a portion of the ADC interface 209 that are connected to the enabled phase interpolator 201B and the third set of sub-ADCs are also enabled. Conversely, the clock divider 203A, clock delay circuits T_7d, T_3d, T_5d, T_1d, T_2d, and T_6d, track and hold circuits TH_7d, TH_3d, TH_5d, TH_1d, TH_2d, and TH_6d, and a portion of the ADC interface 209 that are connected to the disabled phase interpolator 201A and the disabled portion of the sub-ADC 207 are also disabled.

Figure 5:
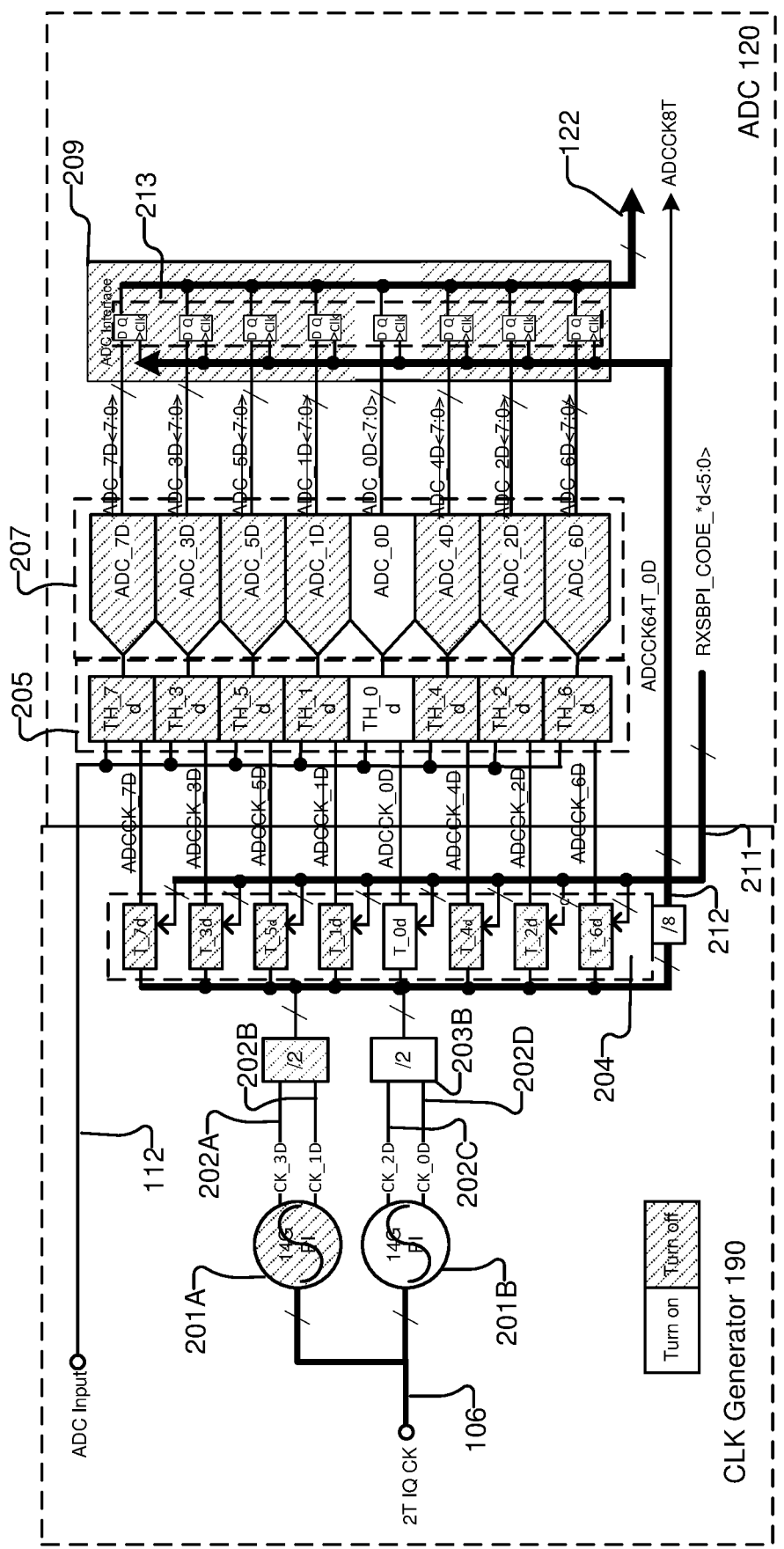
FIG. 5 is a detailed block diagram of the ADC and clock generator in the receiver of FIG. 1 operating at a fourth data rate, according to an embodiment.

FIG. 5 is an example of the receiver 100 operating at the minimum data rate of the receiver 100. For example, the receiver 100 is operating at 8 Gbps baud rate. The ADC 120 shown in FIG. 5 is reconfigured to a minimum data rate mode.

In the minimum data rate mode, the clock generator 190 and the ADC 120 are respectively reconfigured such that a single phase interpolator and a fourth set of sub-ADCs 207 are used in the minimum data rate mode. In one embodiment, the fourth set of sub-ADCs 207 includes a single sub-ADC 207. For example, in the minimum data rate mode phase interpolator 201B and sub-ADC 0D are enabled (e.g., turned on) and phase interpolator 201A and sub ADCs 7D, 6D, 5D, 4D, 3D, 2D, and 1D are disabled (e.g., turned off). Although ADC_0D is enabled, in other embodiments any of the other sub-ADCs that are connected to phase interpolator 201B may be used in the minimum data rate mode.

Furthermore, the clock divider 203B, clock delay circuits T_0d, track and hold circuit TH_0d, and a portion of the ADC interface 209 that are connected to the enabled phase interpolator 201B and sub-ADC_6D are also enabled. Conversely, the clock divider 203A, clock delay circuits T_7d, T_6d, T_5d, T_4d, T_3d, T_2d, and T_1d, track and hold circuits TH_7d, TH_6d, TH_5d, TH_4d, TH_3d, TH_2d, and TH_1d, and a portion of the ADC interface 209 that are connected to the disabled phase interpolator 201A and the disabled portion of the sub-ADC 207 are also disabled.

Figure 6:
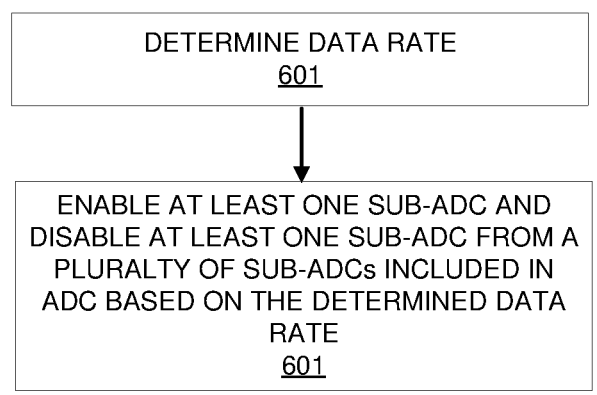
FIG. 6. is a method flow diagram describing a method for reconfiguring the ADC, according to an embodiment.

FIG. 6 is a method flow diagram describing how to reconfigure an ADC 120 of the receiver 100 according to one embodiment. Note in other embodiments, other steps may be shown than those illustrated in FIG. 6.

In one embodiment, the receiver 100 determines 601 a data rate that the receiver 100 will receive data. Based on the determined data rate, the receiver 100 enables 601 at least one sub-ADC from a plurality of sub-ADCs included in each time-interleaved ADC 120 and disables at least one sub-ADC from the plurality of sub-ADCs included in each time-interleaved ADC 120 of the receiver 100 based on the determined data rate.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a receiver having ADCs with an adjustable sampling clock through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A receiver comprising:
   a clock generator including circuitry that generates a plurality of sampling clock signals having a plurality of sampling phases, each of the plurality of sampling clock signals having a corresponding one of the plurality of sampling phases; and
   a plurality of time-interleaved analog-to-digital converters (ADC), each of the plurality of time-interleaved ADCs including a plurality of sub-ADCs that sample an analog input signal, wherein each of the plurality of sub-ADCs sample the analog input signal at one of the plurality of sampling phases that corresponds to the sub-ADC to convert the sampled analog input signal into a digital sample;
   wherein responsive to the receiver being configured to operate at a first data rate, a first set of the plurality of sub-ADCs of at least one of the plurality of time-interleaved ADCs and a first portion of the circuitry of the clock generator are enabled to sample the analog input signal at the first data rate; and
   wherein responsive to the receiver being configured to operate at a second data rate that is different from the first data rate, a second set of the plurality of sub-ADCs of the at least one of the plurality of time-interleaved ADCs and a second portion of the circuitry of the clock generator are enabled to sample the analog input signal at the second date rate, the second set of the plurality of sub-ADCs including sub-ADCs that are different from the sub-ADCs from the first set, and the second portion of the circuitry different from the first portion of the circuitry.

2. The receiver of claim 1, wherein the circuitry of the clock generator includes:
a plurality of phase interpolators that receive a reference clock signal, each phase interpolator generating a plurality of clock signals based on the reference clock signal, wherein each of the plurality of clock signals have a different sampling phase;
a plurality of clock dividers, each of the plurality of clock dividers receiving the plurality of clock signals from a corresponding one of the plurality of phase interpolators and generating a portion of the plurality of sampling clock signals having the plurality of sampling phases of the clock generator.

3. The receiver of claim 2, wherein responsive to the second data rate being a maximum data rate of the receiver, the second set of the plurality of sub-ADCs that is enabled includes all of the plurality of sub-ADCs of all of the plurality of time-interleaved ADCs, and wherein the second portion of the circuitry that is enabled includes all of the plurality of phase interpolators and all of the plurality of clock dividers included in the clock generator.

4. The receiver of claim 3, wherein responsive to the first data rate being half of the maximum data rate of the receiver, the first set of the plurality of sub-ADCs that is enabled includes half of the plurality of sub-ADCs of all of the plurality of time-interleaved ADCs, and wherein the second portion of the circuitry that is enabled includes half of the plurality of phase interpolators and half of the plurality of clock dividers included in the clock generator.

5. The receiver of claim 4, wherein a remaining half of the plurality of sub-ADCs of all of the plurality of time-interleaved ADCs are disabled, and wherein a remaining half of the plurality of phase interpolators and a remaining half of the plurality of clock dividers included in the clock generator are disabled.

6. The receiver of claim 3, wherein responsive to the first data rate being a minimum data rate of the receiver, the first set of the plurality of sub-ADCs that is enabled includes one of the plurality of sub-ADCs included in each of the plurality of time-interleaved ADCs, and wherein the second portion of the circuitry that is enabled includes one of the plurality of phase interpolators and one of the plurality of clock dividers included in the clock generator.

7. The receiver of claim 6, wherein a remaining plurality of sub-ADCs of all of the plurality of time-interleaved ADCs are disabled, and wherein a remaining plurality of phase interpolators and a remaining plurality of clock dividers included in the clock generator are disabled.

8. The receiver of claim 1, wherein each of the plurality of sub-ADCs includes a plurality of time-interleaved successive approximation (SAR) ADC slices.

9. The receiver of claim 2, wherein each of the plurality of time-interleaved ADCs further comprises:
an ADC interface that receives digital samples of the sampled analog input signal from the plurality of sub-ADCs and aligns the digital samples for output.

10. The receiver of claim 9, wherein responsive to the receiver being configured to operate at the first data rate, a first portion of the ADC interface that is connected to the first set of the plurality of sub-ADCs is enabled and a remaining portion of the ADC interface that is not connected to the first set of the plurality of sub-ADCs is disabled.

11. The receiver of claim 10, wherein each of the plurality of sub-ADCs includes a register that stores a value that either enables or disables the sub-ADC, each of the plurality of phase interpolators includes a register that stores a value that either enables or disables the phase interpolator, and each of the plurality of clock dividers includes a register that stores a value that either enables or disables the clock divider.

12. A method of a receiver that includes a clock generator and a plurality of time-interleaved analog-to-digital converters (ADC) comprising a plurality of sub-ADCs, the method comprising:
generating a plurality of sampling clock signals having a plurality of sampling phases using circuitry of the clock generator, each of the plurality of sampling clock signals having a corresponding one of the plurality of sampling phases;
sampling an analog input signal using each of the plurality of sub-ADCs, the analog input signal sampled by each of the plurality of sub-ADCs at one of the plurality of sampling phases that corresponds to the sub-ADC to convert the sampled analog input signal into a digital sample;
wherein responsive to the receiver being configured to operate at a first data rate, enabling a first set of the plurality of sub-ADCs of at least one of the plurality of time-interleaved ADCs and a first portion of the circuitry of the clock generator to sample the analog input signal at the first data rate; and
wherein responsive to the receiver being configured to operate at a second data rate that is different from the first data rate, enabling a second set of the plurality of sub-ADCs of the at least one of the plurality of time-interleaved ADCs and a second portion of the circuitry of the clock generator to sample the analog input signal at the second data rate, the second set of the plurality of sub-ADCs including sub-ADCs that are different from the sub-ADCs from the first set, and the second portion of the circuitry different from the first portion of the circuitry.

13. The method of claim 12, wherein the circuitry of the clock generator includes a plurality of phase interpolators and a plurality of clock dividers, the method further comprising:
receive a reference clock signal at the plurality of phase interpolators;
generating, by each of the plurality of phase interpolators, a plurality of clock signals based on the reference clock signal, wherein each of the plurality of clock signals have a different sampling phase;
receiving, by each of the plurality of clock dividers, the plurality of clock signals from a corresponding one of the plurality of phase interpolators; and
generating, by each of the plurality of clock dividers, a portion of the plurality of sampling clock signals having the plurality of sampling phases.

14. The method of claim 13, wherein enabling the second set of the plurality of sub-ADC and enabling the second portion of the circuitry comprises:
responsive to the second data rate being a maximum data rate of the receiver, enabling all of the plurality of sub-ADCs of all of the plurality of time-interleaved ADCs, and enabling all of the plurality of phase interpolators and all of the plurality of clock dividers included in the clock generator.

15. The method of claim 14, wherein enabling the first set of the plurality of sub-ADC and enabling the first portion of the circuitry comprises:
responsive to the first data rate being half of the maximum data rate of the receiver, enabling half of the plurality of sub-ADCs of each of the plurality of time-interleaved ADCs, and enabling half of the plurality of phase interpolators and half of the plurality of clock dividers included in the clock generator.

16. The method of claim 15, further comprising:
disabling a remaining half of the plurality of sub-ADCs of all of the plurality of time-interleaved ADCs, and
disabling a remaining half of the plurality of phase interpolators and a remaining half of the plurality of clock dividers included in the clock generator.

17. The method of claim 14, wherein enabling the first set of the plurality of sub-ADC and enabling the first portion of the circuitry comprises
responsive to the first data rate being a minimum data rate of the receiver, enabling one of the plurality of sub-ADCs included in each of the plurality of time-interleaved ADCs, and enabling one of the plurality of phase interpolators and one of the plurality of clock dividers included in the clock generator.

18. The method of claim 17, further comprising:
disabling remaining sub-ADCs of all of the plurality of time-interleaved ADCs, and disabling a remaining plurality of phase interpolators and a remaining plurality of clock dividers included in the clock generator.

19. The method of claim 12, wherein each of the plurality of time-interleaved ADCs further comprises an ADC interface, the method further comprising:
receiving, by the ADC interface, digital samples of the sampled analog input signal from the plurality of sub-ADCs connected to the ADC interface; and
aligning the digital samples; and
outputting the aligned digital samples.

20. The method of claim 19, further comprising:
responsive to the receiver being configured to operate at the first data rate, enabling a first portion of the ADC interface that is connected to the first set of the plurality of sub-ADCs and disabling remaining portions of the ADC interface that are not connected to the first set of the plurality of sub-ADCs.

21. A receiver comprising:
a clock generator including circuitry that generates a plurality of sampling clock signals having a plurality of sampling phases, each of the plurality of sampling clock signals having a corresponding one of the plurality of sampling phases, the circuitry of the clock generator including:
a plurality of phase interpolators that receive a reference clock signal, each phase interpolator generating a plurality of clock signals based on the reference clock signal, wherein each of the plurality of clock signals have a different sampling phase;
a plurality of clock dividers, each of the plurality of clock dividers receiving the plurality of clock signals from a corresponding one of the plurality of phase interpolators and generating a portion of the plurality of sampling clock signals having the plurality of sampling phases of the clock generator; and
a plurality of time-interleaved analog-to-digital converters (ADC), each of the plurality of time-interleaved ADCs including a plurality of sub-ADCs that sample an analog input signal, wherein each of the plurality of sub-ADCs sample the analog input signal at one of the plurality of sampling phases that corresponds to the sub-ADC to convert the sampled analog input signal into a digital sample;
wherein responsive to the receiver being configured to operate at a first data rate, a first set of the plurality of sub-ADCs of at least one of the plurality of time-interleaved ADCs and a first portion of the circuitry of the clock generator are enabled to sample the analog input signal; and
wherein responsive to the receiver being configured to operate at a second data rate that is different from the first data rate, a second set of the plurality of sub-ADCs of the at least one of the plurality of time-interleaved ADCs and a second portion of the circuitry of the clock generator are enabled to sample the analog input signal, the second set of the plurality of sub-ADCs including sub-ADCs that are different from the sub-ADCs from the first set, and the second portion of the circuitry different from the first portion of the circuitry.

* * * * *